United States Patent
Sohrabi et al.

(10) Patent No.: US 12,324,172 B2
(45) Date of Patent: Jun. 3, 2025

(54) FIELD-EFFECT BIPOLAR TRANSISTOR

(71) Applicant: The Regents of the University of California, Oakland, CA (US)

(72) Inventors: Mohammad-Hadi Sohrabi, Davis, CA (US); Liu Xiaoguang, Davis, CA (US); Omeed Momeni, Davis, CA (US); Mohamadali Malakoutian, Davis, CA (US)

(73) Assignee: The Regents of the University of California, Oakland, CA (US)

(*) Notice: Subject to any disclaimer, the term of this patent is extended or adjusted under 35 U.S.C. 154(b) by 580 days.

(21) Appl. No.: 17/267,752

(22) PCT Filed: Aug. 16, 2019

(86) PCT No.: PCT/US2019/046879
§ 371 (c)(1),
(2) Date: Feb. 10, 2021

(87) PCT Pub. No.: WO2020/037241
PCT Pub. Date: Feb. 20, 2020

(65) Prior Publication Data
US 2021/0313458 A1    Oct. 7, 2021

Related U.S. Application Data

(60) Provisional application No. 62/765,076, filed on Aug. 17, 2018.

(51) Int. Cl.
*H10D 12/00*    (2025.01)
*H10D 62/10*    (2025.01)
*H10D 62/17*    (2025.01)

(52) U.S. Cl.
CPC ......... *H10D 12/411* (2025.01); *H10D 62/116* (2025.01); *H10D 62/393* (2025.01)

(58) Field of Classification Search
CPC .... H10B 63/32; H10D 12/211; H10D 12/411; H10D 30/6891; H10D 62/116; H10D 62/393; H10D 64/511; H10D 64/519
(Continued)

(56) References Cited

U.S. PATENT DOCUMENTS

2002/0055229 A1    5/2002    Kanamori
2008/0182394 A1*   7/2008    Yang ................ H01L 29/66659
                                                              438/510
(Continued)

FOREIGN PATENT DOCUMENTS

EP    1965437    *   9/2008
EP    2079111    *   7/2009
JP    2006-24922        1/2006

OTHER PUBLICATIONS

International Search Report and Written Opinion of the Korean Patent Office for PCT Patent Application No. PCT/US2019/046879 dated Dec. 6, 2019.

*Primary Examiner* — Fazli Erdem
(74) *Attorney, Agent, or Firm* — Greer, Burns & Crain, Ltd.; Steven P. Fallon

(57) ABSTRACT

The disclosed embodiments relate to the design of a new type of transistor called a "field-effect bipolar transistor" (FEBT). This FEBT includes a substrate, which comprises a body of the FEBT. It also includes a source comprising an N+ doped region of the substrate, and a drain comprising a P+ doped region of the substrate. The FEBT also includes one or more gates composed of a dielectric material, and a low-doped or undoped semiconductor channel sandwiched between the one or more gates and the substrate, wherein the low-doped or undoped semiconductor channel is bounded by the source and the drain.

14 Claims, 11 Drawing Sheets

(58) Field of Classification Search
USPC .......................................................... 257/139
See application file for complete search history.

(56) References Cited

U.S. PATENT DOCUMENTS

| | | | | |
|---|---|---|---|---|
| 2008/0272406 | A1* | 11/2008 | Banna | H10D 64/411 |
| | | | | 257/E29.127 |
| 2008/0312088 | A1* | 12/2008 | Chung | H01L 29/16 |
| | | | | 257/29 |
| 2012/0187494 | A1* | 7/2012 | Huang | H01L 29/94 |
| | | | | 257/E27.06 |
| 2013/0021061 | A1* | 1/2013 | Bjoerk | H01L 29/7391 |
| | | | | 257/E29.264 |
| 2014/0198551 | A1* | 7/2014 | Louie | G11C 15/04 |
| | | | | 365/49.1 |
| 2015/0035034 | A1 | 2/2015 | Winstead et al. | |
| 2015/0084154 | A1* | 3/2015 | Hsu | H01L 27/027 |
| | | | | 257/491 |
| 2015/0097238 | A1* | 4/2015 | Zhang | H01L 29/66575 |
| | | | | 257/408 |
| 2017/0084738 | A1* | 3/2017 | Zhang | H01L 29/063 |
| 2018/0158912 | A1* | 6/2018 | Han | G11C 16/26 |
| 2018/0358352 | A1* | 12/2018 | Voldman | H01L 27/0255 |
| 2020/0185512 | A1* | 6/2020 | Voinigescu | H01L 29/423 |
| 2022/0216237 | A1* | 7/2022 | Dünkel | H01L 29/792 |

\* cited by examiner

FIELD-EFFECT BIPOLAR TRANSISTOR

RELATED APPLICATION

This application claims priority under 35 U.S.C. § 119 to U.S. Provisional Application No. 62/765,076, entitled "Field Effect Bipolar Transistor" by inventors Mohammad-Hadi Sohrabi, Xiaoguang Liu and Omeed Momeni, filed on 17 Aug. 2018, the contents of which are incorporated herein by reference.

BACKGROUND

Field

The disclosed embodiments generally relate to new transistor designs. More specifically, the disclosed embodiments relate to the design of a new field-effect bipolar transistor (FEBT), which is implemented on a unilateral silicon substrate that is fully compatible with bipolar complementary metal-oxide silicon (BiCMOS), complementary metal-oxide silicon (CMOS) and silicon-on-insulator (SOI) technology.

Related Art

Continuing improvements in information technology have led to dramatically increased data rates for both computers and data-communication systems. However, as data rates increase toward tens or hundreds of gigahertz, existing complementary metal-oxide silicon (CMOS) transistor designs are not keeping pace with associated switching speeds and power consumption requirements associated with the increasing number of transistors per unit area. This requires novel designs to keep pace with the continual improvements associated with Moore's law.

Hence, what is needed are new transistor designs, which are practical to implement, compatible with current designs and technology and are capable of providing increased switching speeds with reasonable power consumption requirements.

SUMMARY

The disclosed embodiments relate to the design of a new type of transistor called a "field-effect bipolar transistor" (FEBT). This FEBT includes a substrate, which comprises a body of the FEBT. It also includes a source comprising an N+ (or P+) doped region of the substrate, a drain comprising a P+ (or N+) doped region of the substrate, and a reverse-drain comprising a P+ (or N+) doped region. The FEBT also includes one or more gates composed of a dielectric material, and a low-doped or undoped semiconductor channel sandwiched between the one or more gates and the substrate, wherein the low-doped or undoped semiconductor channel is bounded by the source and the drain.

In some embodiments, the one or more gates include a first gate and a second gate, which comprise separate terminals of the FEBT.

In some embodiments, during a given mode of operation, the first and second gates are biased in one of the following ways: the first gate is negatively biased and the second gate is negatively biased; the first gate is negatively biased and the second gate is positively biased; the first gate is positively biased and the second gate is negatively biased; or the first gate is positively biased and the second gate is positively biased.

In some embodiments, the FEBT further comprises shallow trench isolation (STI) areas surrounding the FEBT, wherein the STI areas isolate the FEBT from the reverse-drain surrounding the transistor.

In some embodiments, the substrate comprises a P− doped semiconductor substrate with an associated reverse-drain comprising a P+ doped ohmic connection.

In some embodiments, the substrate comprises an N− doped semiconductor substrate with an associated reverse-drain comprising an N+ doped ohmic connection.

In some embodiments, a storage element, comprising a floating gate (FG) or a phase change material (PCM), is affixed on top of the source or on top of the semiconductor channel to provide a switching device for non-volatile storage.

In some embodiments, the FEBT is configured to operate in an abrupt-switching mode, wherein the source current abruptly increases when a drain-source voltage of FEBT reaches a switching threshold.

In some embodiments, the FEBT is configured to operate in a controllable-negative-resistance mode, wherein a negative resistance between the drain and the source is controllable.

In some embodiments, the FEBT is configured to operate in a controllable-threshold-voltage mode, wherein a switching voltage threshold for the FEBT is controllable.

In some embodiments, the FEBT is configured to operate in a controllable-negative-capacitance mode, wherein a negative capacitance for the FEBT is controllable.

In some embodiments, the FEBT is configured to operate in a wide-bandwidth mode.

In some embodiments, the FEBT is configured to operate in an adjustable-hysteresis mode, wherein hysteresis is adjustable to facilitate memory applications.

In some embodiments, the FEBT is configured to operate in different modes by adjusting one or more of the following: a reverse-drain voltage with respect to the source; a gate voltage with respect to the source; a source-to-drain distance; a source-to-reverse-drain distance; a gate overlap with the source and/or the drain; and a doping profile of the source, the drain and/or the body.

In some embodiments, the FEBT is implemented in complementary metal-oxide-semiconductor (CMOS) technology.

In some embodiments, the FEBT is implemented in fin field-effect transistor (FinFET) technology.

In some embodiments, the FEBT is implemented in silicon on insulator (SOI) technology.

DETAILED DESCRIPTION

Figure 1A:
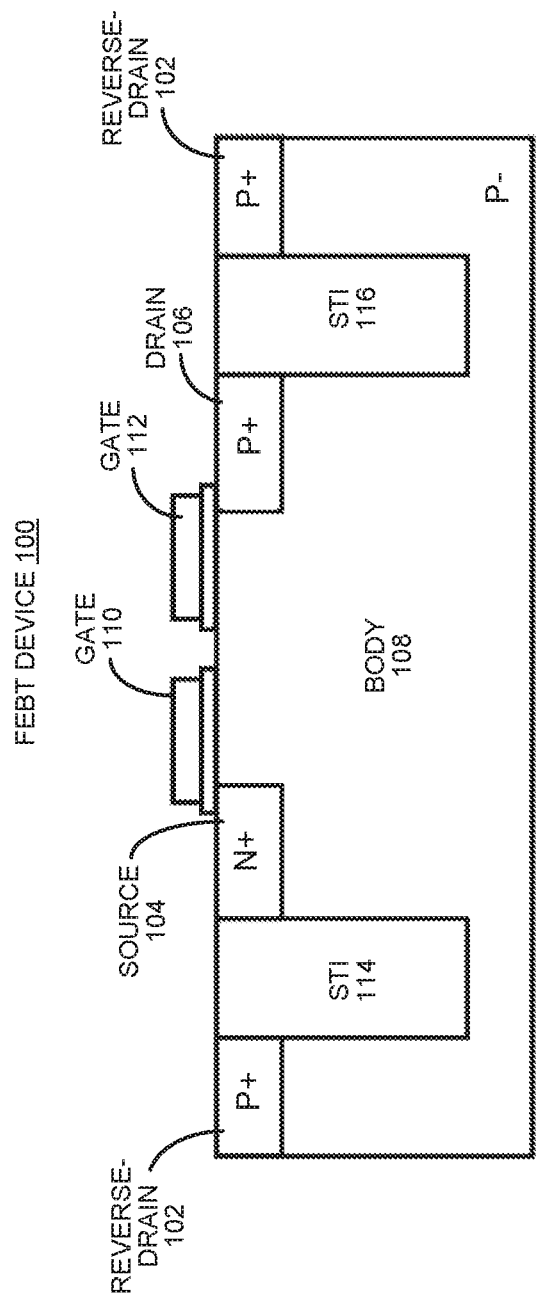
FIG. 1A illustrates a cross-sectional schematic of a FEBT in accordance with the disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Overview

The disclosed embodiments relate to a new design for a field-effect bipolar transistor (FEBT), which is fabricated on a unilateral silicon substrate that is fully compatible with BiCMOS/CMOS technology. Steady-state characteristics of the device facilitate: current-controlled negative differential resistance; zero sub-threshold swing between ON and OFF states at a switching point (<1 mV/decade); zero-loss switching with above 60 dB on/off contrast; adjustable hysteresis with field-effect channel charge modulation using gates; ovonic switching; and negative transconductance. These characteristics can be used independently, or can be fully integrated with the existing and future BiCMOS/CMOS implementations at various technology nodes, which are suitable for: static and dynamic memory structures; logic gates; on-chip electrostatic discharge protection; amplifiers; power amplifiers; oscillators; charge pumps; switches; duplexers; mixers; variable attenuator; and high-current devices. This is all integrated into one single component, which can be controlled externally to provide various characteristics. The architecture of the device makes it both simple and compact, with no additional cost for integrated circuit design and/or integration with other electronic designs, either on-chip or off-chip, and with minimal changes required for systems that are adapted to use the FEBT depending on the desired functionality of FEBT.

Device Structure

A cross-section of an exemplary FEBT device 100 is shown in FIG. 1A. The FEBT device 100 illustrated in FIG. 1A is a five-terminal device, which includes an N+ doped source 104, two gates 110 and 112, a P+ doped drain 106, and a transistor body 108, which is accessible through from an ohmic contact, which surrounds the device and is referred to as a "reverse-drain" 102. Each of the terminals 104, 106, 108, 110 and 112 provides control over the carrier transport between the terminals to facilitate different transfer characteristics for the device for different modes of operation.

As illustrated in FIG. 1A, a low-doped or undoped semiconductor channel is sandwiched between two gate dielectrics 110 and 112 and a P– doped body 108 of the semiconductor substrate, and is bounded by a source comprising an N+ (or P+) doped region of the substrate and a drain comprising a P+ (or N+) doped region of the substrate. (For purposes of this disclosure, implanted doped areas are represented by capital letters such as P, P+, P–, N, N+, N–, and electrostatically induced charges as well as mobile carriers are represented by lower-case letters, such as p or n.)

The transistor structure illustrated in FIG. 1A can be isolated from reverse-drain 102 by the shallow trench isolation (STI) areas 114 and 112. If the device is on a P-type substrate, the reverse-drain 102 requires P+ type doping to make an ohmic contact. Otherwise, if the device is on an N-type substrate, the reverse-drain 102 requires N+ type doping.

Note that the N+ type source 104, the P+ type drain 106, and the P– type body 108 are connected via the semiconductor body of the transistor internally and through ohmic contacts to external circuitry for appropriate biasing or other matching circuitries. In contrast, gates 110 and 112 are only ohmically connected to external circuitry due to isolation from the channel via the dielectric material. The structure of this FEBT resembles that of a MOSFET with bipolar doping, P type and N type, for source 104 and drain 106 regions, respectively, so the charge-flow mechanism requires bipolar carriers for conduction rather than unipolar carriers, such as in a MOSFET.

Figure 1B:
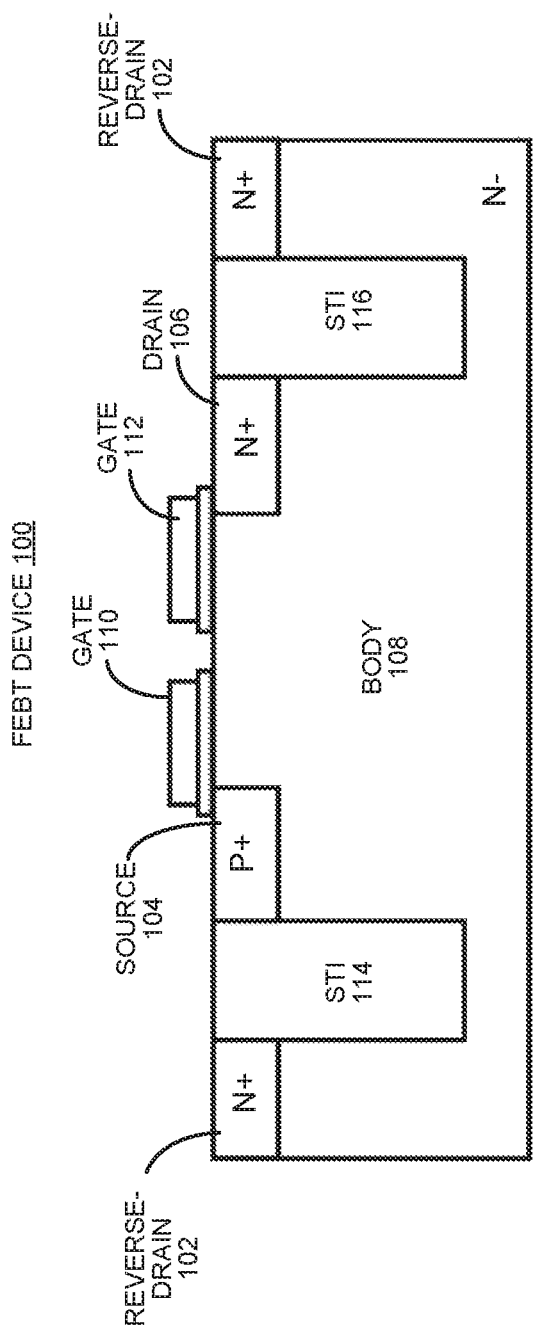
FIG. 1B illustrates a cross-sectional schematic of an alternative design for the FEBT with different polarities in accordance with the disclosed embodiments.
Figure 1C:
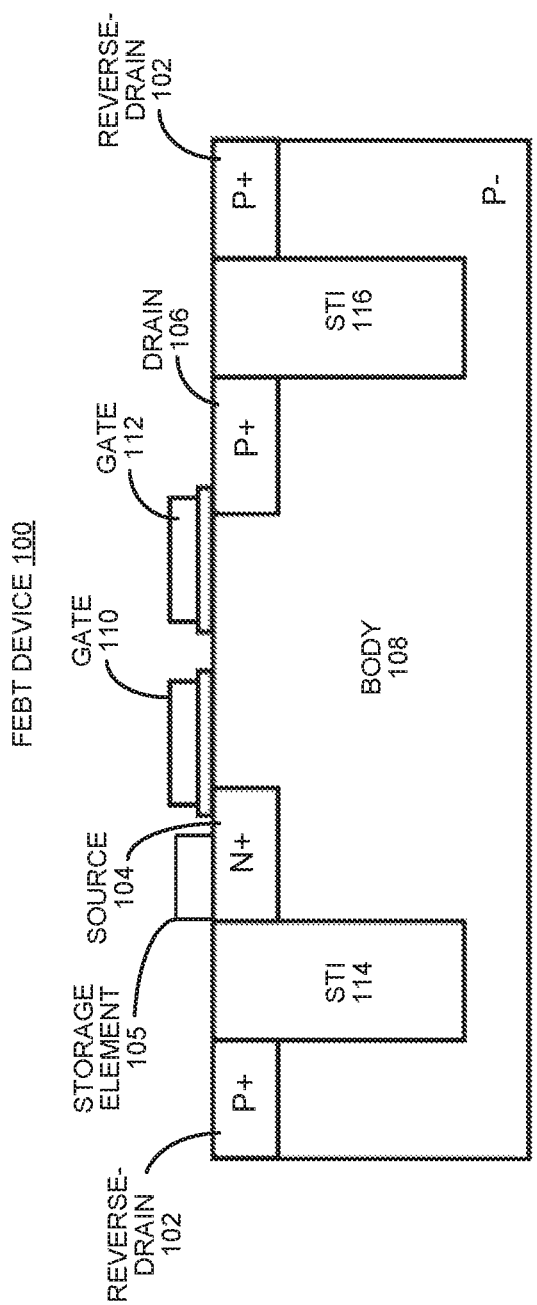
FIG. 1C illustrates a cross-sectional schematic of an alternative design for the FEBT, which includes a storage element, in accordance with the disclosed embodiments.
Figure 1D:
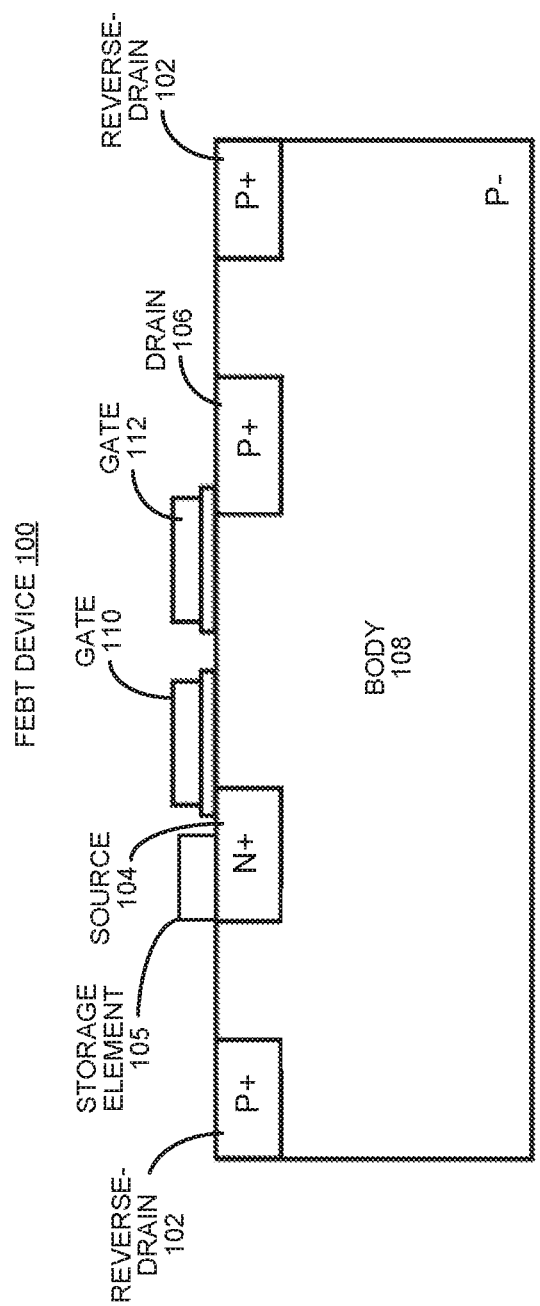
FIG. 1D illustrates a cross-sectional schematic of an alternative design for the FEBT, which does not include STI areas, in accordance with the disclosed embodiments.

There exist a number of alternative designs for the FEBT transistor illustrated in FIG. 1A. FIG. 1B illustrates an alternative design that has an opposite polarity, wherein source 104 is P+ doped and drain 106 is N+ doped. FIG. 1C illustrates another alternative design that includes a storage element 105, comprising a floating gate (FG) or a phase change material (PCM), which can be affixed on top of source 104 or on top of the semiconductor channel, to provide a non-volatile storage. Read and write operations to storage element 105 can be facilitated through appropriate biasing of the terminals of FEBT device 100. In an unillustrated variation on this storage-element design, the storage element can be located between the gate electrode and the gate dielectric, wherein this variation is referred to as a "double-gate architecture." FIG. 1D illustrates yet another alternative design for a FEBT, which does not include STI areas. This FEBT transistor structure can also be implemented in FinFET technology for so-called "short channel structures," although reverse-drains may or may not be used in this type of structure.

Device Symbol

Figure 2:
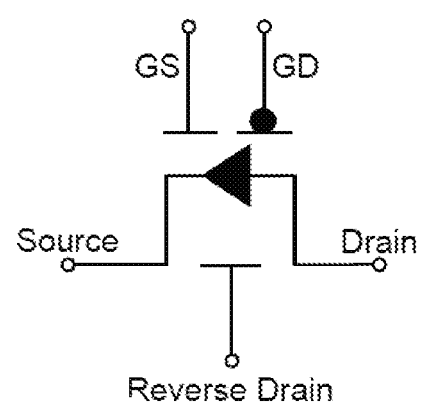
FIG. 2 illustrates a proposed symbol for a FEBT in accordance with the disclosed embodiments.

To provide consistency with symbolism used by the electronic community, and in particular with field-effect transistors, we propose that the FEBT transistor be represented by the symbol that appears in FIG. 2. In this symbol, the black triangle is the signature of FEBT structure, which shows the voltage-controlled channel, and the black dot represents the application of a negative potential at the gate near the P+ doped drain to electrostatically induce a p-type channel as the anode of the device for forward current conduction.

Electrical Characteristics

Figure 3A:
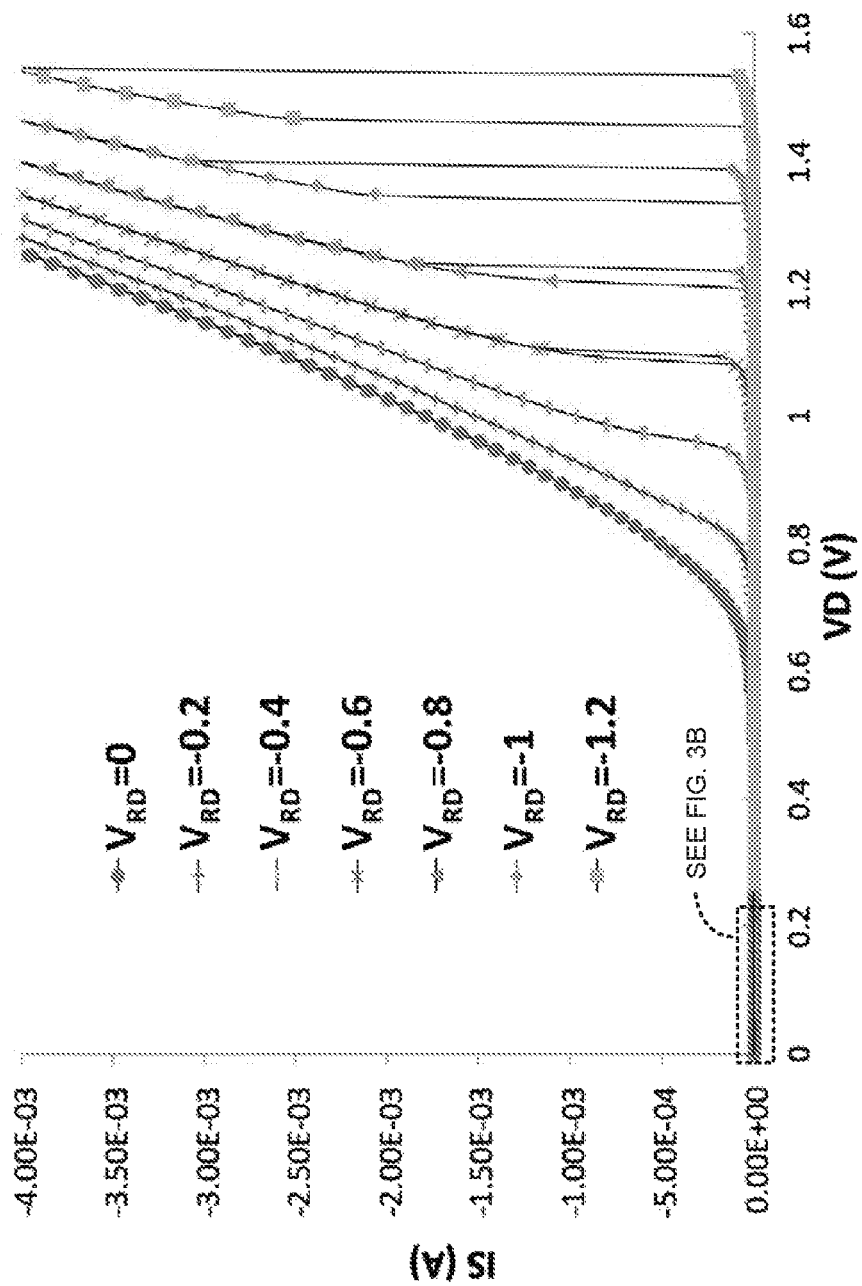
FIG. 3A presents an I-V curve illustrating switching and hysteresis characteristics for a FEBT in accordance with the disclosed embodiments.
Figure 3B:
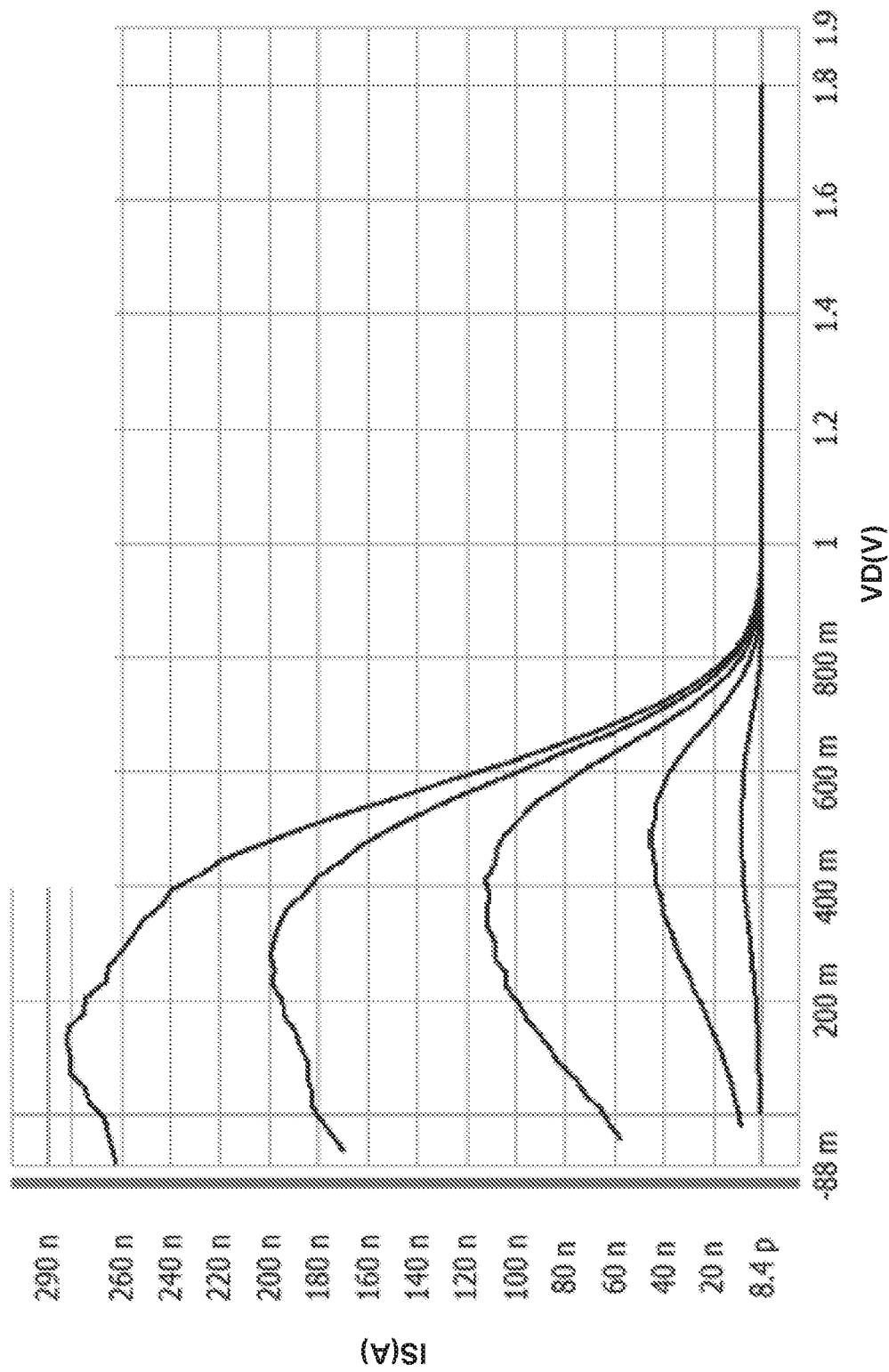
FIG. 3B presents an enlargement of a low-voltage portion of the I-V curve illustrated in FIG. 3A, which exhibits Esaki or tunnel diode-like characteristics, in accordance with the disclosed embodiments.
Figure 3C:
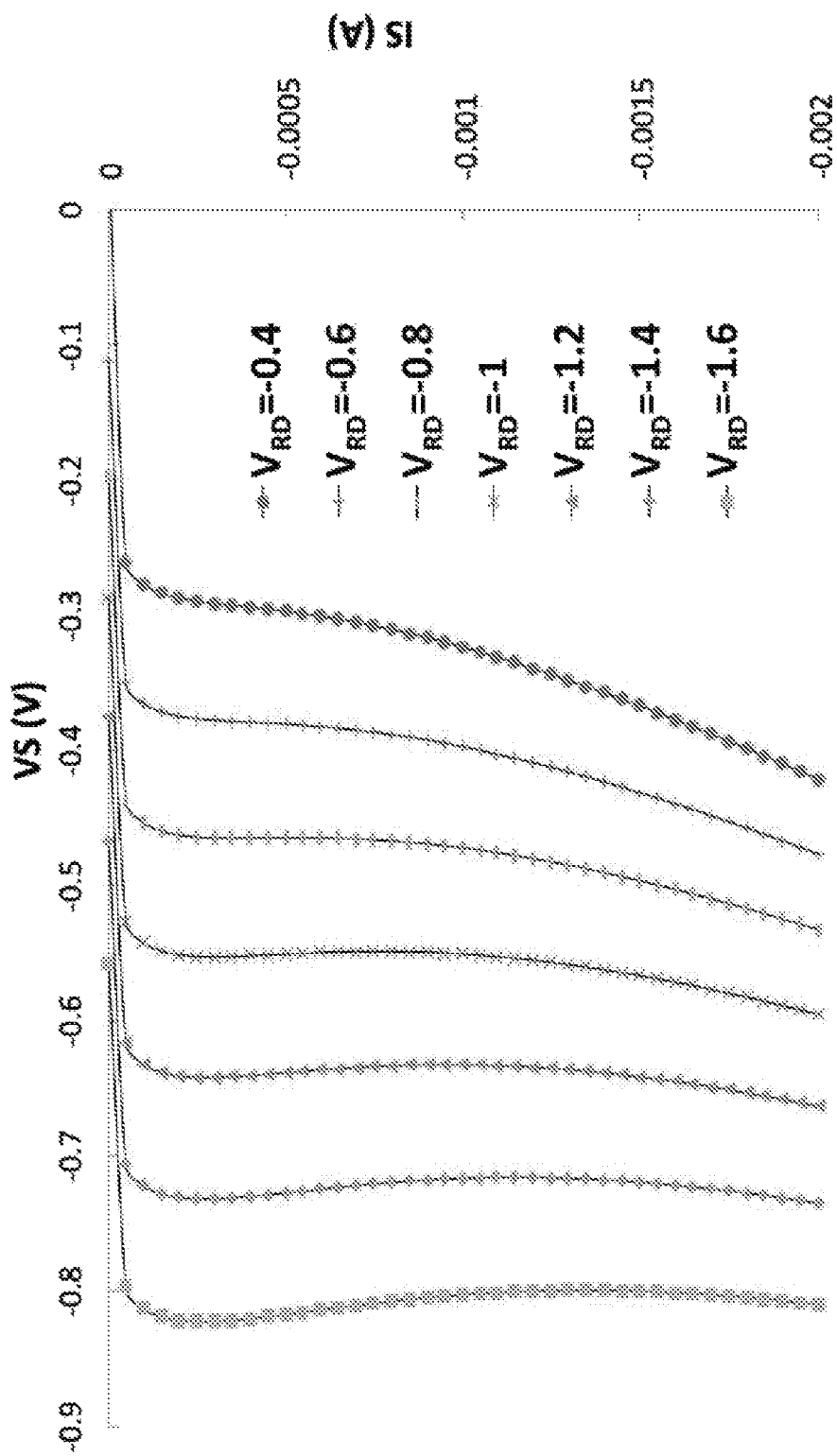
FIG. 3C presents an I-V curve illustrating S-shaped negative differential resistance characteristics of a FEBT in accordance with the disclosed embodiments.

FIG. 3A presents a graph illustrating source current IS(A) as a function of drain voltage VD(V) or source current IS(A) as a function of source voltage VS(V) for different amounts of negative reverse-drain voltage VRD(V). FIG. 3B provides a magnified view of the low-voltage regime in the graph in FIG. 3A, which is highlighted by the dashed box in the lower left-hand corner of the graph. Note that the behavior of the device in this low-voltage regime exhibits characteristics of a tunnel diode or Esaki diode, which also has a voltage-controlled negative resistance, but with a reversed slope. FIG. 3C presents a graph illustrating source current IS(A) as a function of source voltage VS(V) in accordance with the arrangement in FIG.

The purpose of the special arrangement of the gates illustrated in FIGS. 1A and 1B is to electrostatically trap bipolar charges under the gates for current modulation at the ohmic ports. Note that the reverse-drain 102 is used to make a reverse-bias connection between the N+ (or P+) doped region comprising the source 104 and the P− (or N−) type body of the transistor 108. As the drain voltage increases to more positive values, zero sub-threshold swing switching behavior with hysteresis is observed in the graph in FIG. 3A. Note that if current from the same node is swept, and the voltage response at each node is sampled, the device behaves as a negative differential resistance until it starts acting as a passive resistor when injecting more current. This quantitatively describes the hysteresis window, and is quantitatively consistent over the range of voltage sweep.

Floating Body Mode

If the FEBT is connected to external potential sources via source 104, drain 106, gate 110, gate 112 and has no reverse-drain connection, it behaves like a diode with a variable dynamic resistance controlled by gates 110 and 112, due to modulation of the carrier densities under gates 110 and 112, and can be considered to be a field-effect diode (FED), which has been proposed previously for SOT structures. If gate 110 is positively biased and gate 112 is negatively biased, the dynamic resistance of the FED changes around and above the threshold voltages of the N+/n/p/P+, like a double-diffused impact-ionization-avalanche-transit-time (IMPATT) diode, or if gate 110 is negatively biased and gate 112 is positively biased N+/p/n/P+, like a thyristor structure. However, due to substrate conduction bypass between source 104 and drain 106, channel conduction is undermined, and the device has no OFF state regardless of the polarity or magnitude of the gate 110 and gate 112 potentials up to the material breakdown limit.

Accumulation Mode

Accumulation mode of FEBT can be configured by applying a positive voltage to reverse-drain 102, which results in resistive behavior between the drain 106 terminal, and the reverse-drain terminal 102. It also creates a forward-biased diode between the body 108 and the source 104, provided that the potential on source 104 is less than the potential of body 108. Due to the magnitude of the current between source 104 and body 108, or between drain 106 and body 108, as compared to the magnitude of the current between source 104 and drain 106, the P+/P−/N+ structure of the channel exhibits little change in transconductance due to the change in the potentials of gates 110 and 112. Hence, steady-state characteristics of a diode are observed in the connection between source 104 and drain 106.

Linear Mode

Figure 4:
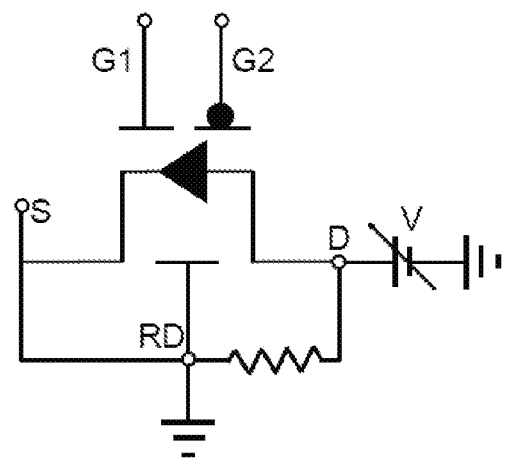
FIG. 4 presents a schematic of a FEBT in a linear mode in accordance with the disclosed embodiments.

The device can also be configured to exhibit linear characteristics. Depletion mode of the FEBT occurs when the source 104 is connected to the body 108 of the device, and when a positive voltage is applied to drain 106. If gate 110 (on the source side) is positively biased and if gate 112 (on the drain side) is negatively biased, the structure under the channel will turn into a forward-biased N+/n/p/P+ field-effect diode. As in the accumulation regime of operation, there are three main paths for current flow: (1) the body-drain DC current path, which essentially is a resistor; (2) the body-source substrate path, which is externally shorted; and (3) the N+/P−/P+ path under the channel. In this situation, if voltage is swept across drain 106, and current is measured at source 104, the device will exhibit linear diode characteristics. To be more clear, it acts like the device illustrated by the circuit diagram that appears in FIG. 4, which is simply a diode in parallel with a resistor. Note that if the resistor is small compared with the ON conductance of the diode, the static behavior of FEBT will change to that of a linear resistor.

Also note that applying voltage to the gates will cause the slope of the resistance characteristics in a corresponding IV graph to change, so FEBT can effectively become a variable resistor. Moreover, applying negative voltages to the source 104 terminal can change the turn-on point of the variable resistor as long as the drain-source voltage remains above zero.

Depletion/Snap Mode

Applying negative or zero potential to the surrounding reverse-drain 102 will cause the channel as well as the bulk of the semiconductor between source 104 and drain 106 to be depleted from mobile carriers and essentially turns the structure into a p-i-n (PIN) diode, where the electrostatically induced intrinsic region extends from the N+ side (source 104) to the boundary of P+ region (drain 106) of the FEBT. As the reverse-biased diode between source 104 and body 108 goes deeper into reverse saturation, current at the source 104 terminal is minimized. The only current is due to minority carriers of the channel, which is referred to as a "reverse-saturation" current between source 104 and body 108 and between source 104 and drain 106. This condition is called "deep depletion."

Inversion Mode

After the channel is fully depleted from mobile carriers and deep depletion occurs at low voltages of drain 106, and there exists a reverse bias between source 104 and body 108, as the drain voltage increases to more positive values, the voltage drop across the channel and between drain 106 and body 108 causes the depletion region edge to asymmetrically move away from the highly P+ doped drain 106 toward the N+ doped source 104. This opens up a path for current flow between drain 106 and body 108, while the diode between source 104 and drain 106 still stays reverse biased and no forward current passes through but with a smaller depleted area in the channel. The structure between source 104 and drain 106 now turns into a N+/i/P−/P+ structure, which resembles a Read diode. Meanwhile the diode between source 104 and body 108 is still in reverse bias. As the potential on drain 106 becomes more positive, this boundary moves closer to the source side of the FEBT, and the width of the depletion region decreases and voltage drops across a smaller depleted region, which means that the electric field intensity increases rapidly across the junction until breakdown occurs.

Figure 5:
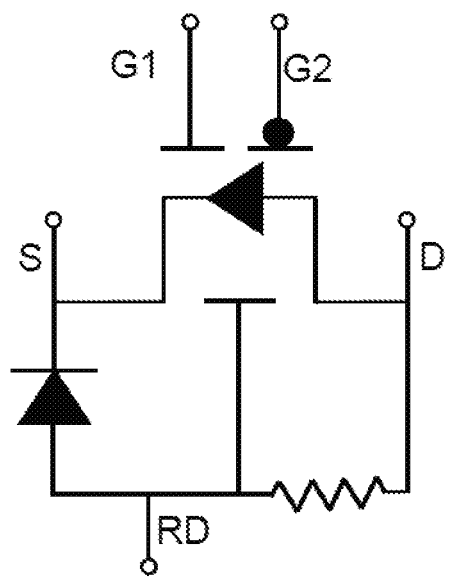
FIG. 5 presents a schematic of a FEBT in an inversion mode in accordance with the disclosed embodiments.

At this point, carriers follow electric field lines from the positive potential drain 106 to the less-positive potential source 104. At the emergence of the breakdown, a sudden current flow path is created because the breakdown point is very close to the source 104 terminal, and a sharp jump in steady-state characteristics of the FEBT occurs. A functional schematic of FEBT in inversion mode is illustrated in FIG. 5.

Note that by decreasing the drain voltage more toward zero potential, the FEBT characteristic exhibits hysteresis where current change does not follow the same path to the OFF state as it did while turning on. This behavior is caused by the extra voltage, which is required to empty the excess of carriers created due to breakdown at the boundary of the source region. This phenomena provides the required configuration for thyristor-based RAMs and one transistor SRAMs.

Four different combinations can be envisaged for gate 110 and gate 112 polarities.

$V_{G110}$, $V_{G112}>V_{DS}$—In this configuration, because both gates are positively biased, channel majority carriers at the gate will turn into n-type and N+/n/n/P+ structures at the surface of the device between the source 104 and drain 106 terminals. In this condition, the source-to-drain current has a direct path to flow through as long as the depletion region of the source 104 and body 108 does not pinch off this channel formation.

$V_{G10}<V_{DS}$, $V_{122}>V_{DS}$—This configuration provides a N/p/n/P+ structure for the source-to-drain path provided that the source-body pinch-off does not intrude into this configuration. This will displace the ON voltage of the FEBT at the onset of breakdown due to a surface potential change caused by gates 110 and 112.

$V_{G110}>V_{DS}$, $V_{G2}<V_{DS}$—This configuration provides a N+/n/p/P+ structure for the source-to-drain path, provided that the source-body pinch-off does not intrude into this configuration. In this configuration, the gate will affect and modulate the OFF-state current, but may not be very influential when the FEBT turns on. This may be caused by the magnitudes of the injected currents from the body to the drain, and from the drain to the source.

$V_{G110}$, $V_{G112}$ $V_{DS}$—This combination of biasing creates a N+/p/p/P+ structure between the source 104 and drain 106 terminals. Note that a change in gate 110 and gate 112 biasing has a negligible effect on characteristics of the FEBT due to a screening effect of the substrate doping in case of P− type doping.

Instead of voltage source, a variable current source can be applied to the source 104 or drain 106 terminals, and the output voltage can be measured, after the device turns on, wherein applying more current causes a reduction in voltage drop across the channel, which describes the negative differential resistance (NDR) phenomena. This is directly due to the breakdown event due to stored charges surrounding the source junction area. As the input current is increased, the device behaves again as a lossy resistor. The slope (magnitude of the resistance), the dynamic range over which the device holds its NDR behavior, and the threshold point can be controlled via potentials applied to source 104, drain 106, reverse-drain 102, and gates 110 and 112.

Note that in short-channel structures such as a FinFET, because the depletion region depth is extruded from the N+ region to fully occupy the channel with no body potential, the reverse-drain may not be needed because the structure is already at full depletion mode.

Schematics of Different Operating Modes

Figure 6:
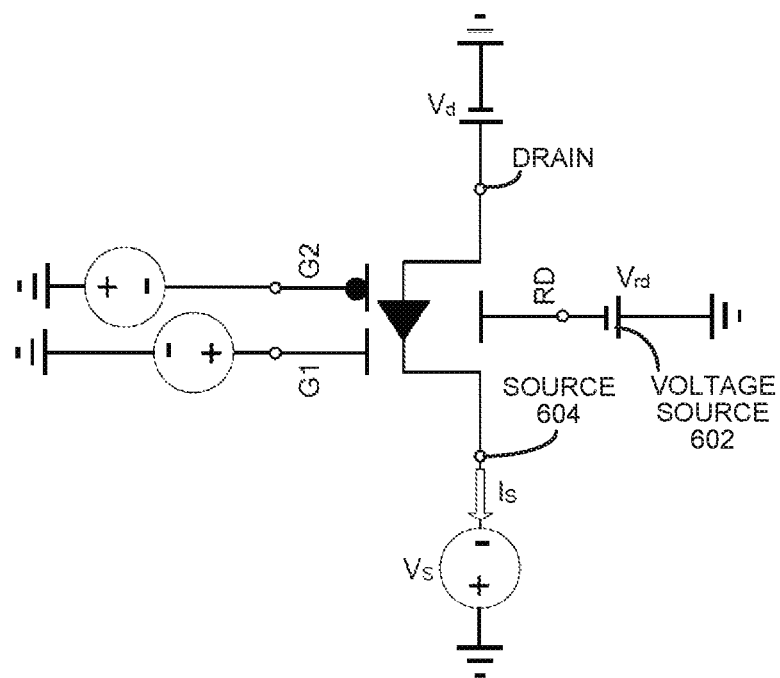
FIG. 6 presents a schematic of a FEBT in switch mode in accordance with the disclosed embodiments.

FIG. 6 presents a schematic of a FEBT operating in switch mode in accordance with the disclosed embodiments. In switch mode, a voltage source 602 is used to control a voltage $V_s$, which is applied to source 604. When the applied voltage is increased to a threshold, the FEBT switches almost instantaneously, and the current suddenly increases with almost zero switching loss.

Figure 7:
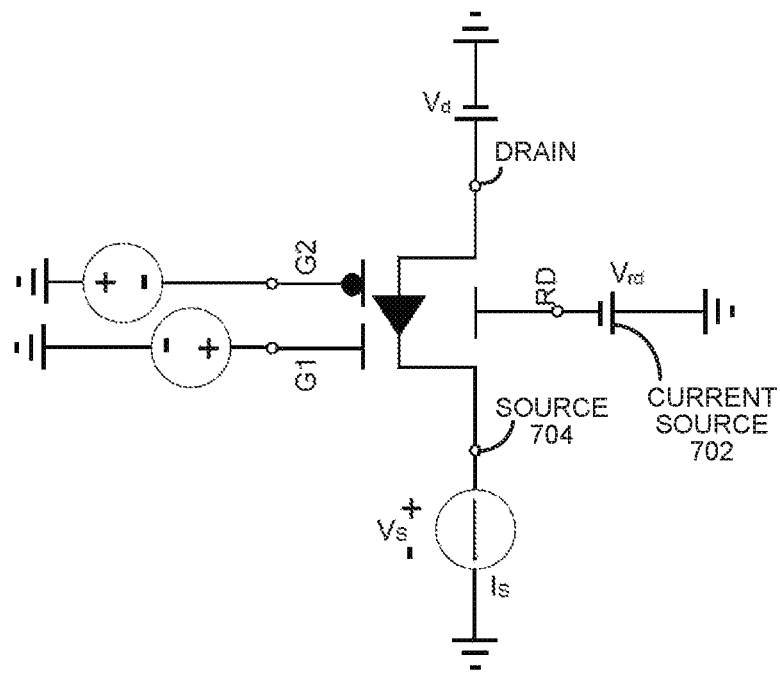
FIG. 7 presents a schematic of a FEBT in negative-differential-resistance (NDR) mode in accordance with the disclosed embodiments.

FIG. 7 presents a schematic of a FEBT in negative-differential-resistance (NDR) mode in accordance with the disclosed embodiments. In NDR mode, a current source 702 is used to control a current from source 704. As this current increases, the source voltage follows the current so that the FEBT effectively implements a current-controlled negative resistance.

Figure 8:
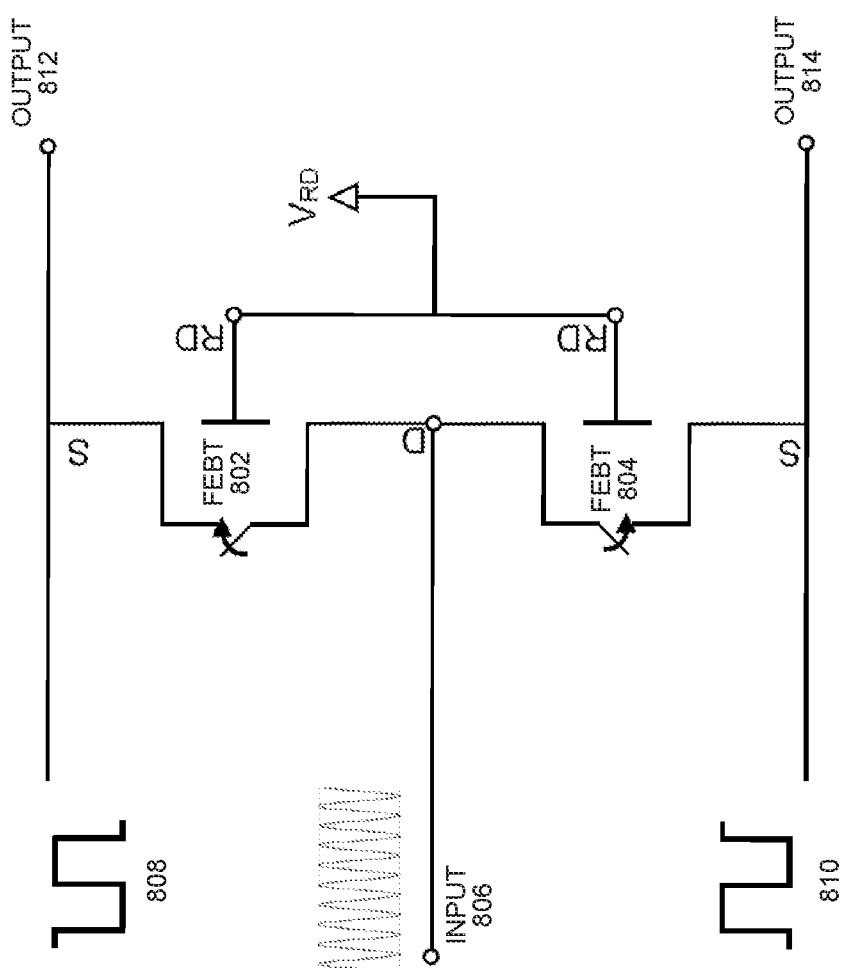
FIG. 8 presents a schematic of single-pole-double-throw (SPDT) switch implemented using two FEBTs in accordance with the disclosed embodiments.

FIG. 8 presents a schematic of single-pole-double-throw (SPDT) switch, which is implemented using two FEBTs 802 and 804 in accordance with the disclosed embodiments. As illustrated in FIG. 8, the drains of FEBTs 802 and 804 are connected to an input 806, which receives a rapidly oscillating input signal. Also, the gate inputs of FEBTs 802 and 804 receive square waves 808 and 810, which are 1800 out-of-phase with each other. This causes the rapid oscillations received at input 806 to be alternately switched between outputs 812 and 804.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A field-effect bipolar transistor (FEBT), comprising:
   a doped semiconductor body;
   a doped source region within the body;
   a doped drain region within the body;
   a channel region of the body between the source region and the drain region;
   a first gate dielectric upon the source region and the channel positioned to isolate a first gate contact from the source region and the channel;
   a second gate dielectric upon the drain region and the channel positioned to isolate a second gate contact from the drain region and the channel;
   a doped reverse-drain region within the body surrounding the source and drain regions; and
   shallow trench isolation regions configured to isolate the source and drain regions from the reverse drain region;
   wherein the source region and the drain region are connected via the body and are connected through ohmic contact to external circuitry, and wherein the first and second gate contacts are only ohmically connected to external circuitry due to isolation from the channel region by the first gate dielectric and the second gate dielectric.

2. The FEBT of claim 1, wherein the source region comprises an N+ doped region, the reverse-drain region comprises a P+ doped region, and the drain region comprises a P+ doped region.

3. The FEBT of claim 1, wherein the source region comprises a P+ doped region, the reverse-drain region comprises an N+ doped region, and the drain region comprises an N+ doped region.

4. The FEBT of claim 1 wherein the body comprises a P− doped semiconductor substrate and the reverse-drain comprises a P+ doped ohmic connection.

5. The FEBT of claim 1, wherein the body comprises an N− doped semiconductor substrate and the reverse-drain comprises an N+ doped ohmic connection.

6. The FEBT of claim 1, comprising a floating gate (FG) or a phase change material (PCM) on top of the source region or on top of the channel configured to provide non-volatile storage.

7. The FEBT of claim 1, wherein the FEBT is configured in a circuit to operate in an abrupt-switching mode, wherein a source current abruptly increases when a drain-source voltage of the FEBT reaches a switching threshold.

8. The FEBT of claim 1, wherein the FEBT is configured in a circuit to operate in a controllable-negative-resistance mode.

9. The FEBT of claim 1, wherein the FEBT is configured in a circuit to operate in a controllable-threshold-voltage mode.

10. The FEBT of claim 1, wherein the FEBT is configured in circuit to operate in a controllable-negative-capacitance mode.

11. The FEBT of claim 1, wherein the FEBT is configured in a circuit to operate in a wide-bandwidth mode.

12. The FEBT of claim 1, wherein the FEBT is configured in a circuit to operate in an adjustable-hysteresis mode.

13. The FEBT of claim 1, wherein the FEBT is configured in a circuit to operate in different modes by adjusting one of more of the following:
   a reverse-drain voltage with respect to the source;
   a gate voltage with respect to the source;
   a source-to-drain distance;
   a source-to-reverse-drain distance;
   a gate overlap with the source and/or the drain; and
   a doping profile of the source, the drain and/or the body.

14. The FEBT of claim 1, wherein the source, drain, channel, and reverse-drain regions are arranged such that the separate ohmic contacts provide control over carrier transport between the separate ohmic contacts.

* * * * *